(12) United States Patent
Sengupta et al.

(10) Patent No.: US 10,811,415 B2
(45) Date of Patent: Oct. 20, 2020

(54) SEMICONDUCTOR DEVICE AND METHOD FOR MAKING THE SAME

(71) Applicant: Samsung Electronics Co., Ltd., Suwon-si, Gyeonggi-do (KR)

(72) Inventors: Rwik Sengupta, Austin, TX (US); Joon Goo Hong, Austin, TX (US); Vassilios Gerousis, Liberty Hill, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/298,887

(22) Filed: Mar. 11, 2019

(65) Prior Publication Data

US 2020/0135735 A1 Apr. 30, 2020

Related U.S. Application Data

(60) Provisional application No. 62/750,696, filed on Oct. 25, 2018.

(51) Int. Cl.
| | |
|---|---|
| *H01L 27/092* | (2006.01) |
| *H01L 23/528* | (2006.01) |
| *H01L 29/66* | (2006.01) |
| *H01L 21/8238* | (2006.01) |
| *H01L 29/78* | (2006.01) |

(52) U.S. Cl.
CPC .. *H01L 27/0924* (2013.01); *H01L 21/823821* (2013.01); *H01L 21/823828* (2013.01); *H01L 23/5286* (2013.01); *H01L 29/66795* (2013.01); *H01L 29/785* (2013.01)

(58) Field of Classification Search
CPC ............ H01L 27/0207; H01L 23/5286; H01L 2027/11881
USPC ......................................................... 257/368
See application file for complete search history.

(56) References Cited

U.S. PATENT DOCUMENTS

| | | | |
|---|---|---|---|
| 8,546,872 B2 | 10/2013 | Sakuma et al. | |
| 8,921,970 B1 | 12/2014 | Or-Bach et al. | |
| 9,177,890 B2 | 11/2015 | Du | |
| 9,564,450 B2 | 2/2017 | Sakuma et al. | |
| 9,570,395 B1 * | 2/2017 | Sengupta ............ | H01L 23/5286 |
| 9,659,963 B2 | 5/2017 | Cheng et al. | |

(Continued)

FOREIGN PATENT DOCUMENTS

WO 2017/111866 A1 6/2017

*Primary Examiner* — Jonathan Han
(74) *Attorney, Agent, or Firm* — Lewis Roca Rothgerber Christie LLP

(57) ABSTRACT

According to some example embodiments of the present disclosure, a semiconductor device includes: a substrate; a first semiconductor layer over the substrate, the first semiconductor layer being a first type of semiconductor device; and a second semiconductor layer over the substrate and the first semiconductor layer, the second semiconductor layer being the first type of semiconductor device, wherein a first portion of the first semiconductor layer overlaps the second semiconductor layer when viewed in a direction perpendicular to a plane of the substrate and a second portion of the first semiconductor layer is laterally offset from the second semiconductor layer when viewed in the direction perpendicular to the plane of the substrate.

20 Claims, 6 Drawing Sheets

(56) References Cited

U.S. PATENT DOCUMENTS

2015/0214239 A1 7/2015 Rhie
2017/0117291 A1* 4/2017 Or-Bach ............ H01L 23/5283

* cited by examiner

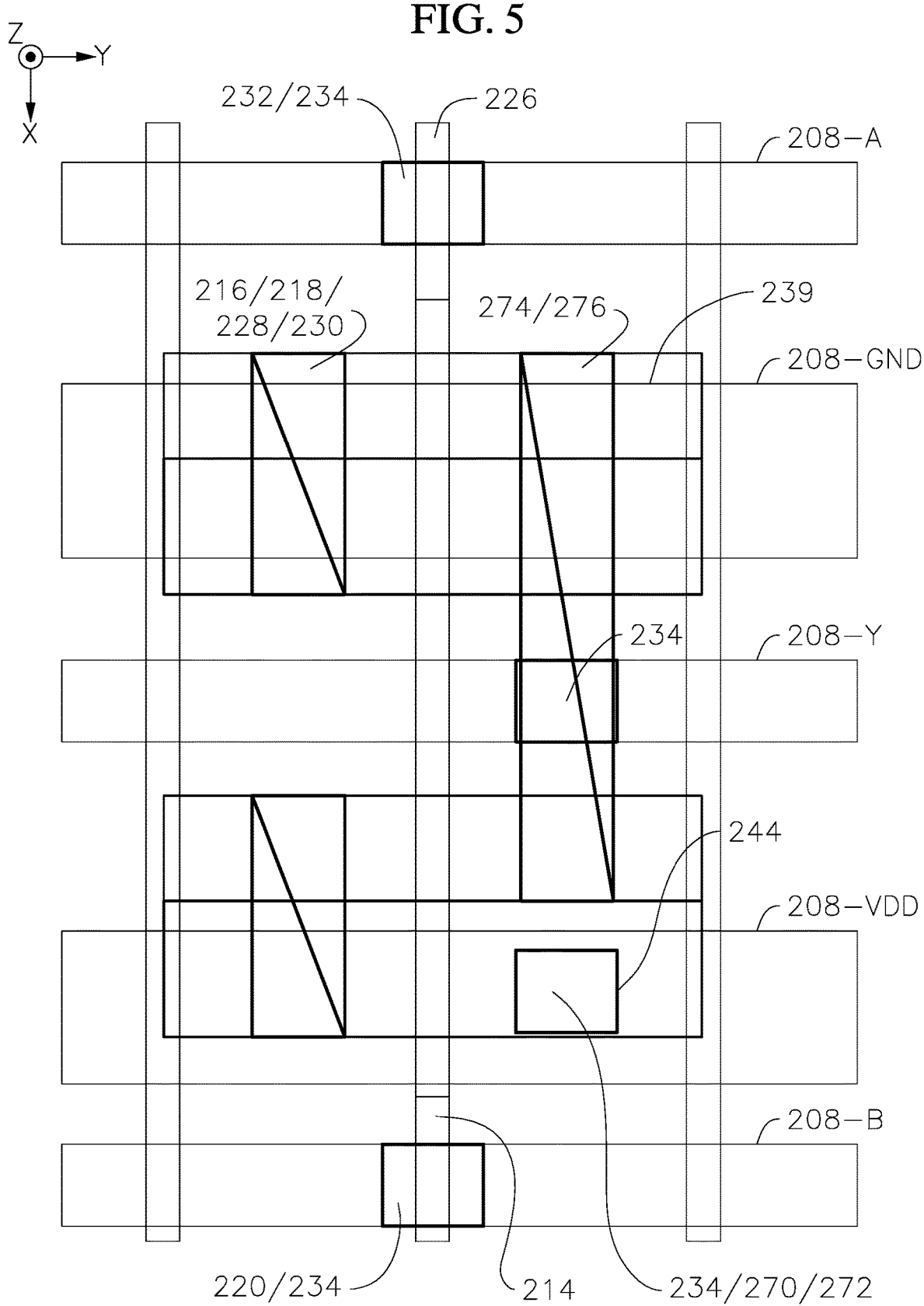

SEMICONDUCTOR DEVICE AND METHOD FOR MAKING THE SAME

CROSS-REFERENCE TO RELATED APPLICATION

The present application claims priority to and the benefit of U.S. Provisional Patent Application No. 62/750,696, entitled "UNIPOLAR STACKED FET FOR MONOLITHIC 3DIC", filed on Oct. 25, 2018, the entire content of which is incorporated herein by reference.

BACKGROUND

Aspects of some example embodiments of the present invention are directed to a semiconductor device and a method of making the same.

Semiconductor devices are commonly found in modern electronic products. Semiconductor devices vary in the number and density of electrical components. Discrete semiconductor devices generally contain one type of electrical component, e.g., light emitting diodes (LEDs), small signal transistors, resistors, capacitor, inductors, and power metal oxide semiconductor field effect transistors (MOSFETs). Integrated semiconductor devices typically contain hundreds to millions of electrical components.

The above information in the Background section is only for enhancement of understanding of the background of the technology and therefore it should not be construed as admission of existence or relevancy of the prior art.

SUMMARY

Aspects of some example embodiments of the present invention are directed to a semiconductor device and a method of making the same.

According to some example embodiments of the present disclosure, a semiconductor device includes: a substrate; a first semiconductor layer over the substrate, the first semiconductor layer being a first type of semiconductor device; and a second semiconductor layer over the substrate and the first semiconductor layer, the second semiconductor layer being the first type of semiconductor device, wherein a first portion of the first semiconductor layer overlaps the second semiconductor layer when viewed in a direction perpendicular to a plane of the substrate and a second portion of the first semiconductor layer is laterally offset from the second semiconductor layer when viewed in the direction perpendicular to the plane of the substrate.

According to some example embodiments, the semiconductor device further includes: a third semiconductor layer over the substrate, the third semiconductor layer being a second type of semiconductor device different from the first type of semiconductor device; and a fourth semiconductor layer over the substrate, the fourth semiconductor layer being the second type of semiconductor device.

According to some example embodiments, a first portion of the third semiconductor layer overlaps the fourth semiconductor layer when viewed in the direction perpendicular to the plane of the substrate and a second portion of the third semiconductor layer is laterally offset from the fourth semiconductor layer when viewed in the direction perpendicular to the plane of the substrate.

According to some example embodiments, the first, second, third, and fourth semiconductor layers correspond to first, second, third, and fourth transistors, respectively.

According to some example embodiments, a first portion of a gate region of the first and third transistors overlaps a gate region of the second and fourth transistors when viewed in the direction perpendicular to the plane of the substrate, and a second portion of the gate region of the first and third transistors is laterally offset from the gate region of the second and fourth transistors when viewed in the direction perpendicular to the plane of the substrate.

According to some example embodiments, a first source or drain electrode corresponding to the first semiconductor layer contacts a first source or drain electrode corresponding to the second semiconductor layer, and a second source or drain electrode corresponding to the first semiconductor layer is laterally isolated from a second source or drain electrode corresponding to the second semiconductor layer.

According to some example embodiments, the semiconductor device further include a buried power rail between the substrate and the first semiconductor layer.

According to some example embodiments of the present disclosure, a semiconductor device includes: a first semiconductor layer, the first semiconductor layer being a first type of semiconductor device; a first gate region at least partially encapsulating the first semiconductor layer; a second semiconductor layer over the first semiconductor layer, the second semiconductor layer being the first type of semiconductor device; and a second gate region at least partially encapsulating the second semiconductor layer, wherein the first semiconductor layer, a first portion of the first gate region, the second semiconductor layer, and the second gate region overlap when viewed along a z-direction, and a second portion of the first gate region is laterally offset from the second gate region when viewed along the z-direction.

According to some example embodiments, the semiconductor device further includes a substrate, wherein the first semiconductor layer, the first gate region, the second semiconductor layer, and the second gate region are formed over the substrate when viewed along the z-direction.

According to some example embodiments, a first portion of the first semiconductor layer overlaps the second semiconductor layer when viewed in a direction perpendicular to a plane of the substrate and a second portion of the first semiconductor layer is laterally offset from the second semiconductor layer when viewed in the direction perpendicular to the plane of the substrate.

According to some example embodiments, the semiconductor device further includes: a third semiconductor layer over the substrate, the third semiconductor layer being a second type of semiconductor device different from the first type of semiconductor device; and a fourth semiconductor layer over the substrate, the fourth semiconductor layer being the second type of semiconductor device.

According to some example embodiments, a first portion of the third semiconductor layer overlaps the fourth semiconductor layer when viewed in the direction perpendicular to a plane of the substrate and a second portion of the third semiconductor layer is laterally offset from the fourth semiconductor layer when viewed in the direction perpendicular to the plane of the substrate.

According to some example embodiments, the first, second, third, and fourth semiconductor layers correspond to first, second, third, and fourth transistors, respectively.

According to some example embodiments of the present disclosure, in a method of making a semiconductor device, the method includes: forming a first semiconductor layer over a substrate, the first semiconductor layer being a first type of semiconductor device; and forming a second semiconductor layer over the substrate and the first semiconductor layer, the second semiconductor layer being the first type of semiconductor device, wherein a first portion of the first semiconductor layer overlaps the second semiconductor layer when viewed in a direction perpendicular to a plane of the substrate and a second portion of the first semiconductor layer is laterally offset from the second semiconductor layer when viewed in the direction perpendicular to the plane of the substrate.

According to some example embodiments, the method further includes: forming a third semiconductor layer over the substrate, the third semiconductor layer being a second type of semiconductor device different from the first type of semiconductor device; and forming a fourth semiconductor layer over the substrate, the fourth semiconductor layer being the second type of semiconductor device.

According to some example embodiments, a first portion of the third semiconductor layer overlaps the fourth semiconductor layer when viewed in the direction perpendicular to the plane of the substrate and a second portion of the third semiconductor layer is laterally offset from the fourth semiconductor layer when viewed in the direction perpendicular to the plane of the substrate.

According to some example embodiments, the first, second, third, and fourth semiconductor layers correspond to first, second, third, and fourth transistors, respectively.

According to some example embodiments, a first portion of a gate region of the first and third transistors overlaps a gate region of the second and fourth transistors when viewed in the direction perpendicular to the plane of the substrate, and a second portion of the gate region of the first and third transistors is laterally offset from the gate region of the second and fourth transistors when viewed in the direction perpendicular to the plane of the substrate.

According to some example embodiments, a first source or drain electrode corresponding to the first semiconductor layer contacts a first source or drain electrode corresponding to the second semiconductor layer, and a second source or drain electrode corresponding to the first semiconductor layer is laterally isolated from a second source or drain electrode corresponding to the second semiconductor layer.

According to some example embodiments, the method further includes forming a buried power rail between the substrate and the first semiconductor layer.

According to some example embodiments, at least one of the first or second semiconductor layer comprises a nanosheet layer, a nanowire layer, or a fin layer

BRIEF DESCRIPTION OF THE DRAWINGS

A more complete appreciation of the present disclosure, and many of the attendant features and aspects thereof, will become more readily apparent as the disclosure becomes better understood by reference to the following detailed description when considered in conjunction with the accompanying drawings, wherein:

FIG. 5 is a top or planar view of the semiconductor device, according to some example embodiments.

DETAILED DESCRIPTION

Figure 1:
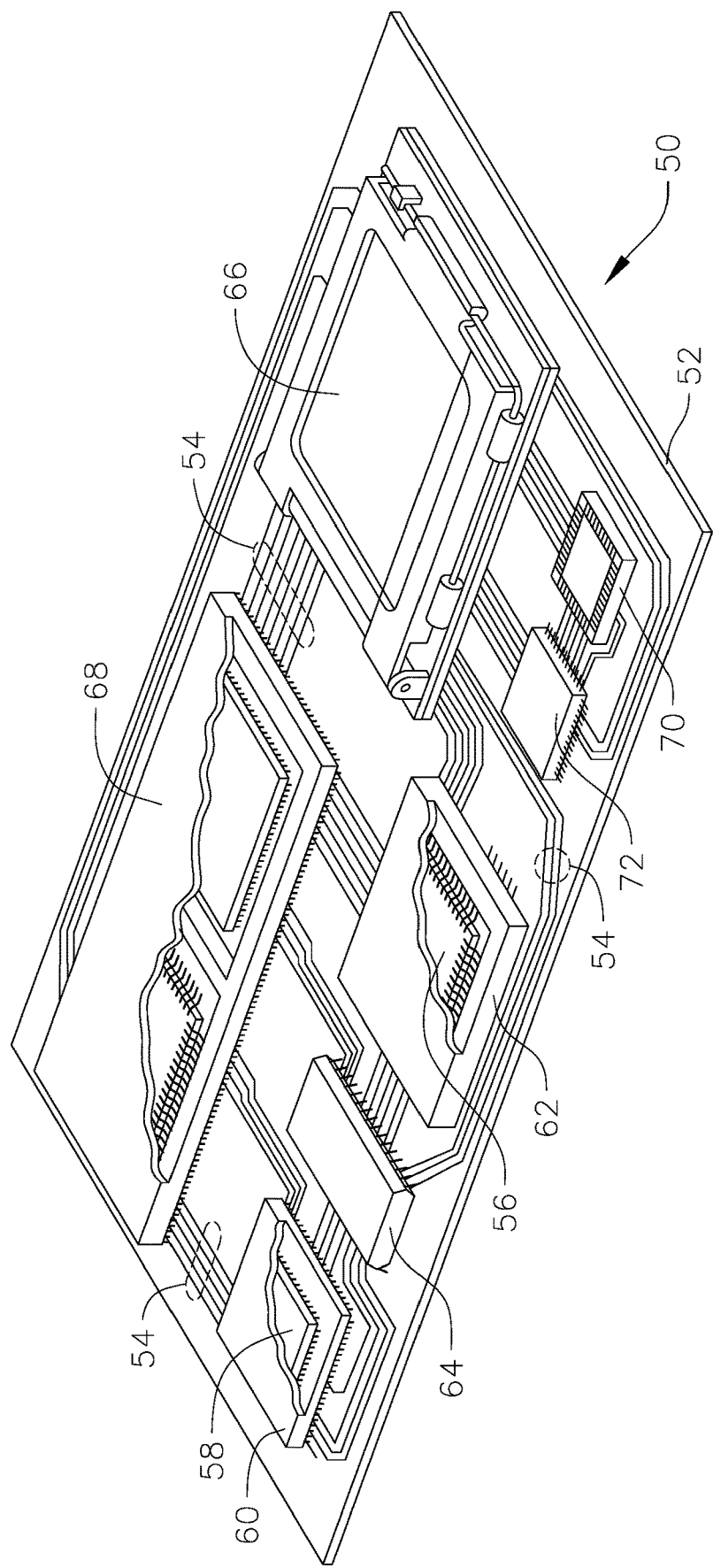
FIG. 1 illustrates an electronic device with various semiconductor packages mounted to its surface, according to some example embodiments.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Aspects and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims.

The use of the terms "a" and "an" and "the" and similar referents in the context of describing the invention (especially in the context of the following claims) are to be construed to cover both the singular and the plural, unless otherwise indicated or clearly contradicted by the context. The terms "comprising," "having," "including," and "containing" are to be construed as open-ended terms (i.e., meaning "including, but not limited to,") unless otherwise noted.

Unless defined otherwise, all technical and scientific terms used herein have the meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment. Examples of integrated semiconductor devices include microcontrollers, microprocessors, charged-coupled devices (CCDs), solar cells, and digital micro-mirror devices (DMDs).

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. According to some embodiments, the electronic device 50 may be a memory device configured to store electronic data. The semiconductor packages can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system design, any combination of semiconductor packages, configured with any combination of first and second level packaging styles, as well as other electronic components, can be connected to PCB 52. In some embodiments, electronic device 50 includes a single attached semiconductor package, while other embodiments may include multiple interconnected packages.

As the footprint of active and passive components have continued to become smaller, it has become more and more difficult to increase the density of components laterally across semiconductor die. Accordingly, semiconductor components and packages according to some example embodiments utilize a stacked three-dimensional (3D) arrangement of active components to increase the density of components in a relatively smaller footprint, by building multiple layers of active components in the z-axis relative to the x-y plane of the semiconductor substrate.

Related art structures that utilize, for example, n-on-p stacking methodologies may form an N-type component on top of a P-type component, or vice versa, which means that the bottom source/drain (e.g., P-type source/drain) may be formed on a lower layer, and the top source/drain (e.g., an N-type source/drain) may be formed direction on top of the bottom source/drain. Similarly, for the gate electrodes, different work function metals may be utilized for components in different tiers. Thus, the manufacturing process for n-on-p stacked structures may be quite complex.

In contrast, some example embodiments according to the present disclosure may overlap n-over-n or p-over-p components thereby improving manufacturing efficiency, because the same type of components are stacked on top of each other in the z-direction. Additionally, some example embodiments according to the present disclosure may reduce thermal budget issues because the manufacturing process of forming the same types of components on top of each other may reduce damage to lower tier components that might otherwise occur. Some example embodiments may further facilitate low cost and complexity interconnections between components.

For example, as will be illustrated and explained in more detail below, a semiconductor device according to some example embodiments may include a plurality of stacked or overlapping nanosheet layers placed in configuration for different functionalities, with isolation between source, drain, and gate terminals of stacked devices. Each layer of nanosheets may form a different device or component. Interconnections between source, drain, and gate terminals may be formed as appropriate according to the design of the semiconductor device, and power connections to source and drain terminals of components in different tiers may be formed as well.

Although the term nanosheet layer may be used throughout the present Specification, the embodiments are not limited to nanosheet layers; rather, the embodiments can include various semiconducting layers, such as nanosheet, nanowire, or fin-like layers.

FIG. 2 is a block diagram illustrating an interconnection scheme for a plurality of active semiconductor device components in a semiconductor device 200, by utilizing multiple tiers of devices. The semiconductor device 200 may be, for example, one of the semiconductor packages illustrated with respect to the electronic device 50 in FIG. 1.

The semiconductor device 200 illustrated in FIG. 2 may include a substrate 202 (e.g., a bulk-silicon substrate or a silicon-on-insulator (SOI) substrate). The semiconductor device 200 may further include a plurality of tiers of semiconductor device components formed over the substrate 202. The semiconductor device 200 illustrated in FIG. 2 shows two tiers (or layers) (204 and 206) of active components below a metal layer 208, but embodiments of the present invention are not limited to two tiers of components, and different example embodiments may include more than two tiers of components. Additionally, as will be illustrated in further detail below, different tiers may include a plurality of nanosheet layers configured to form multiple components within the same tier.

Each tier may include unique components that can be electrically connected or electrically isolated from components in other tiers or in the same tier to perform different logical functionalities according to the design of the electrical circuit. For example, as illustrated in FIG. 2, the first tier (or top tier) 204 of components may include a source region 210, a drain region 212, and a gate region 214, which may be connected to various signal lines of the metal layer 208 to form an active semiconductor component such as an N-type or P-type transistor. The source/drain regions 210/212 may have corresponding source/drain electrodes 216/218, which include any suitable conductive material in contact with the source region 210 and/or drain region 212. Additionally, the gate region 214 may have a corresponding electrode 220, which includes any suitable conductive material in contact with the gate region 214.

Similar to the first tier 204, the second tier (or bottom tier) 206 of components may include a source region 222, a drain region 224, and a gate region 226, which may be connected to various signal lines of the metal layer 208 to form an active semiconductor component such as an N-type or P-type transistor. The source drain regions 222/224 may have corresponding source and drain electrodes 228/230, which include any suitable conductive material in contact with the source region 22 and/or the drain region 224. The gate region 226 may have a corresponding electrode 232, which includes any suitable conductive material in contact with the gate region 226. The conductive component of the gate region 226 is electrically isolated from the substrate 202.

The electrodes 216/218/220/228/230/232 may be electrically connected to one or more signal or power lines of the metal layer 208 by way of one or more vias 234.

Figure 2A:
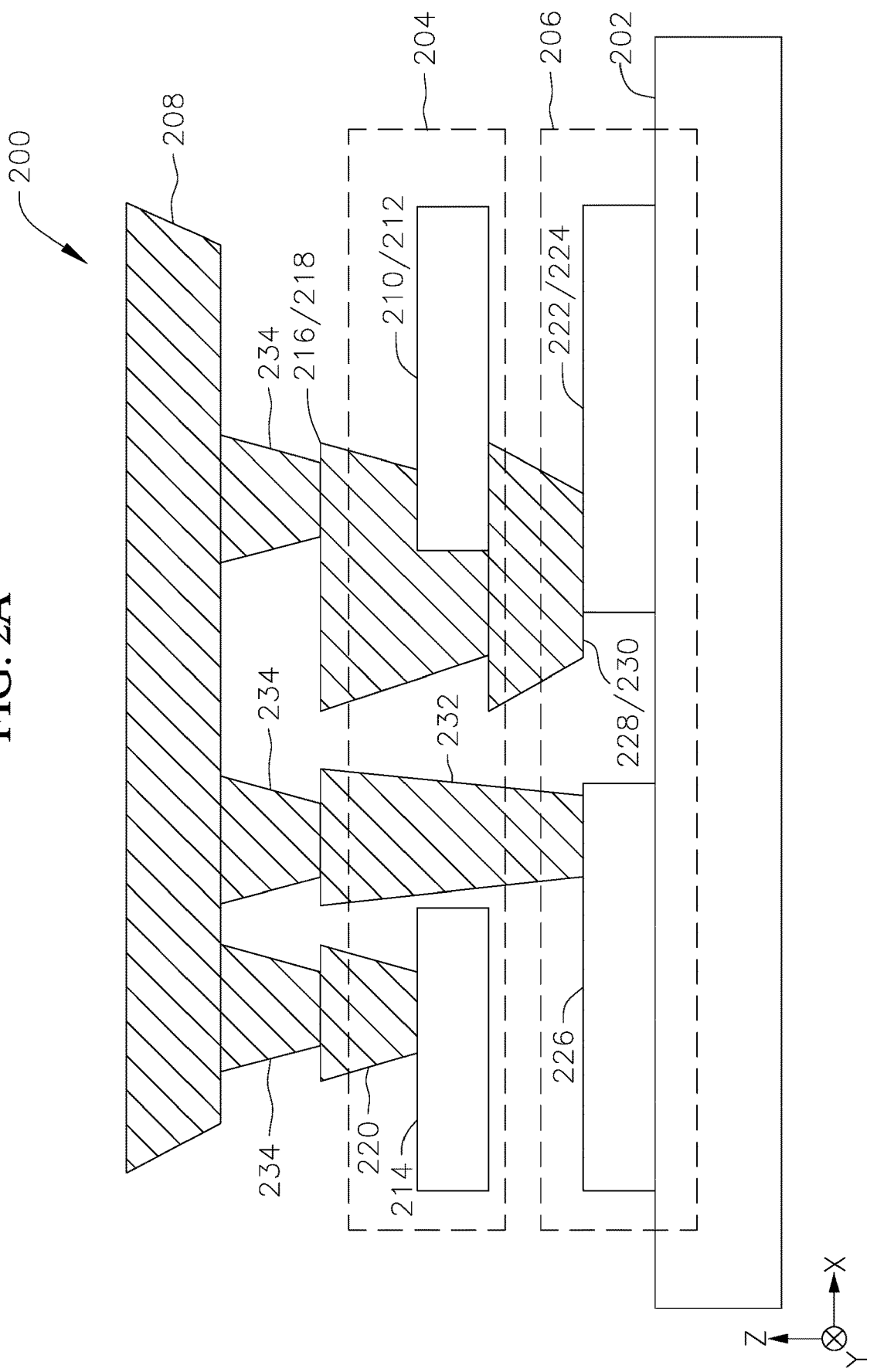
FIG. 2A is a cross-sectional view illustrating aspects of a semiconductor device, according to some example embodiments.

Thus, some example embodiments may utilize multiple gate connections (e.g., 220 and 232) to connect the respective tiers of components to the metal layer 208. For example, as illustrated in FIG. 2A, the gate regions (e.g., 214 and 226) of the different semiconductor components in the different tiers 204 and 206 may be connected to the metal layer 208 by way of independent gate electrodes 220 and 232 that are laterally offset from one another in the x-y plane of the substrate 202, such that the gate electrodes for components in different tiers are laterally offset from one another.

Figure 2B:
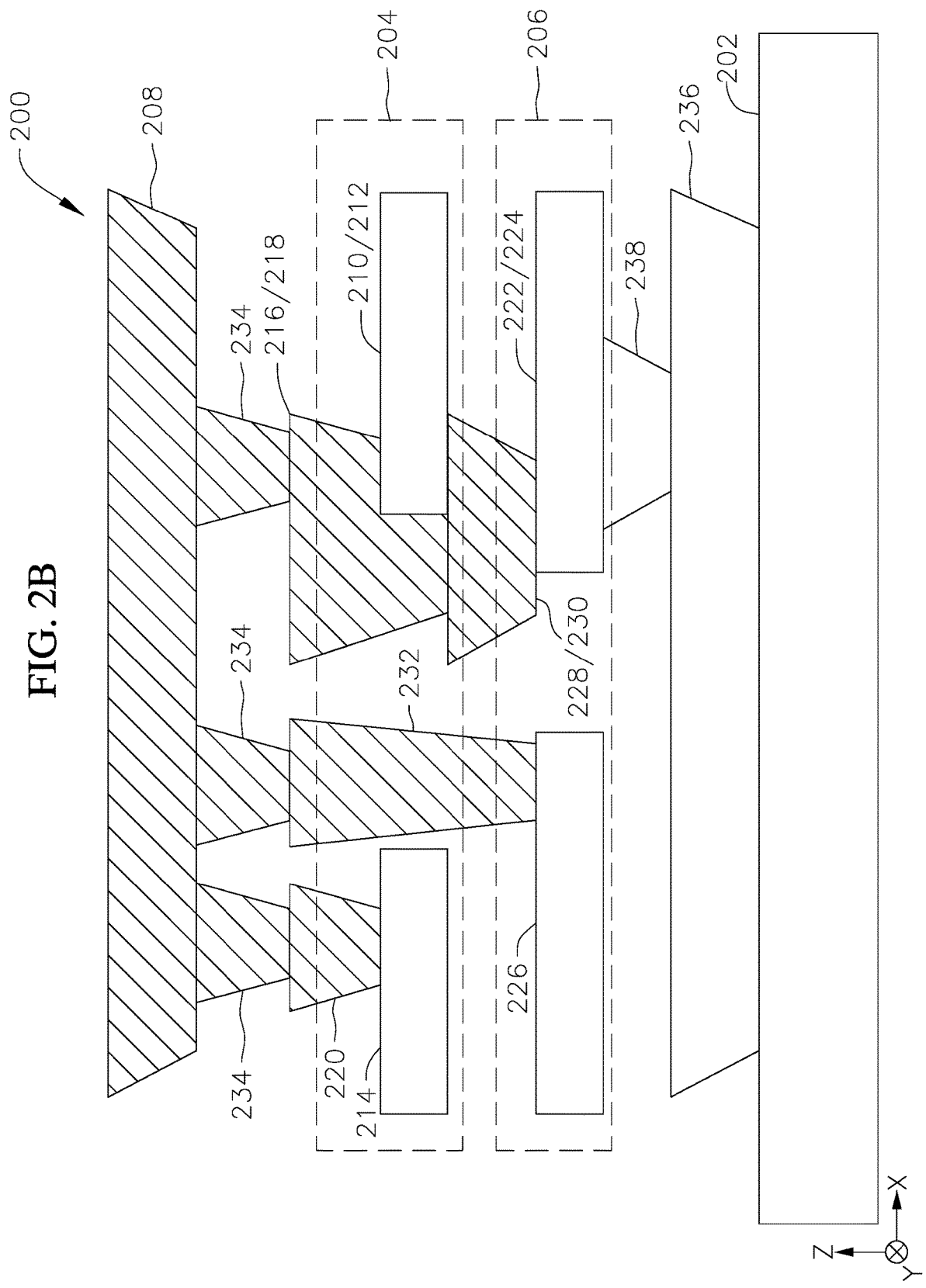
FIG. 2B illustrates a cross-sectional view illustrating further aspects of a semiconductor device, according to some example embodiments.

FIG. 2B illustrates further details of the semiconductor device 200, according to some example embodiments, in which the semiconductor device 200 is further vertically interconnected to a buried power rail 236 for providing power and/or electrical signals to the bottom tier 206 and/or the top tier 204. As shown in FIG. 2B, according to some example embodiments, a buried power rail 236 of one or more layers of any suitable conductive material may be formed over and/or buried within the substrate 202. A buried via 238 may be formed to electrically connect the components of the semiconductor device 200 to the buried power rail 236. For example, as illustrated in FIG. 2B, the via 238 may be formed to electrically connect the bottom source/drain region 222/224 (and/or the source/drain electrodes 228/230) to the buried power rail 236, but embodiments are not limited thereto. In some embodiments, a plurality of vias 238 may be formed to electrically connect various other components or regions (e.g., in any tier) of the semiconductor device 200 to the buried power rail 236.

Figure 3:
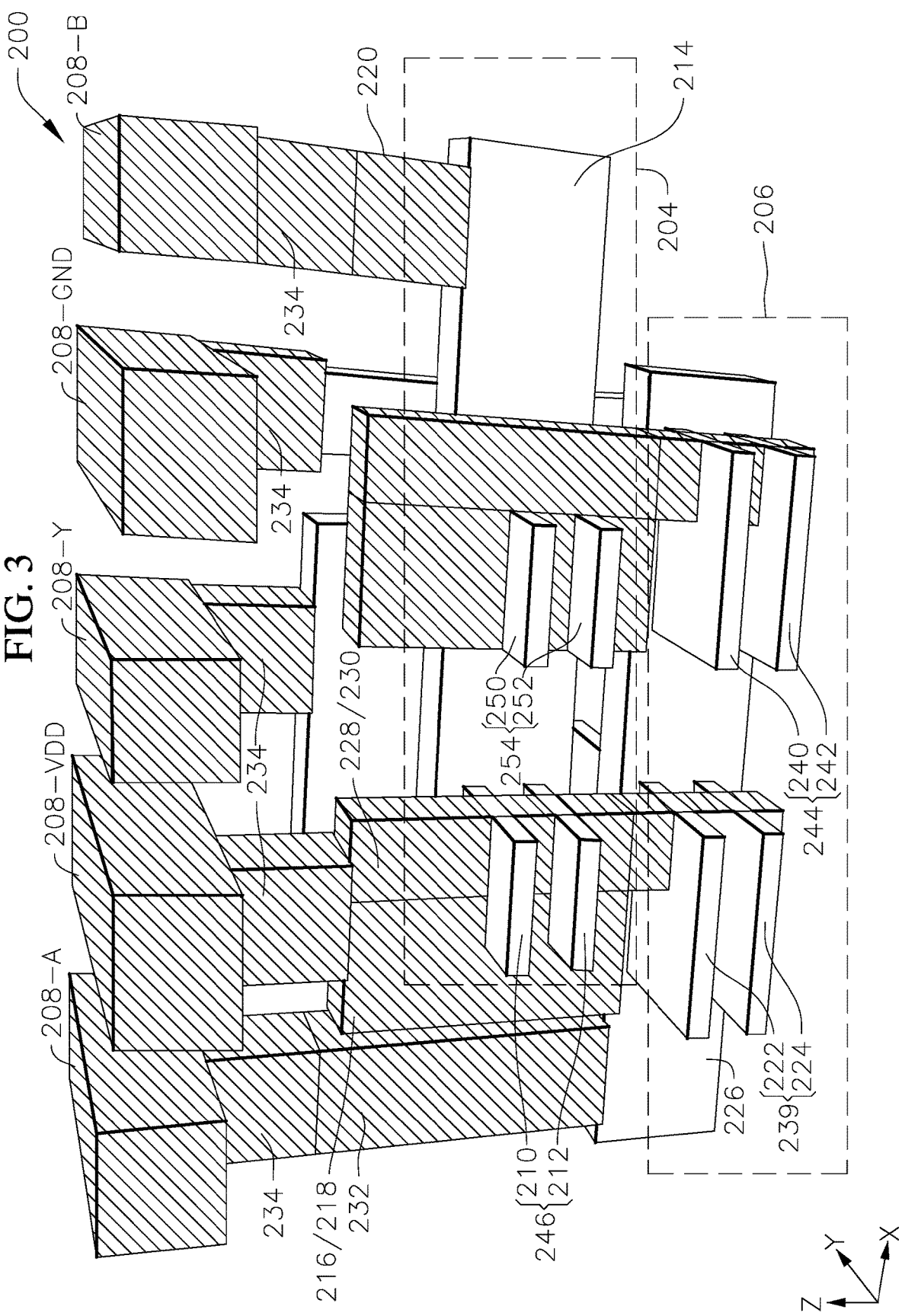
FIG. 3 illustrates a perspective view of a semiconductor device, according to some example embodiments.

FIG. 3 illustrates a three-dimensional perspective view of the semiconductor device according to some example embodiments. As shown in FIG. 3, each tier of the semiconductor device 200 may include a gate region.

For example, the bottom tier 206 may include the bottom gate region 226, and the top tier 204 may include the top gate region 214. Additionally, each tier may include a plurality of nanosheet layers to form, for example, source and drain regions (e.g., the bottom source/drain region 222/224 and the top source/drain region 210/212).

For example, the bottom source and drain region may include the first source region 222 formed by a first nanosheet layer and the first drain region 224 formed by a second nanosheet layer, and collectively, the source region 222, the drain region 224, and the gate region 226 may form a first transistor (e.g., a P-type transistor) 239. The bottom source and drain region may additionally include a second source region 240 formed by a third nanosheet layer and a second drain region 242 formed by a fourth nanosheet layer. Collectively, the source region 240, the drain region 242, and the gate region 226 may form a second transistor (e.g., an N-type transistor) 244.

Similarly, the bottom source and drain region may include a third source region 210 formed by a fifth nanosheet layer and a third drain region 212 formed by a sixth nanosheet layer. Collectively, the source region 210, the drain region 212, and the gate region 214 may form a third transistor (e.g., a P-type transistor) 246. The top source and drain region may additionally include a fourth source region 250 formed by a seventh nanosheet layer, and a fourth drain region 252 formed by an eighth nanosheet layer. Collectively, the source region 250, the drain region 252, and the gate region 214 may form a fourth transistor (e.g., an N-type transistor) 254.

Although the embodiment illustrated in FIG. 3 shows the semiconductor device 200 including four transistors, embodiments of the present invention may include additional transistors or fewer transistors, and may include additional active components, according to the design of the semiconductor device 200.

During the manufacturing process, the various nanosheet layers and gate regions may be doped as appropriate to form P-type or N-type transistors. As illustrated in FIG. 3, each of the nanosheet layers may be encapsulated or surrounded by their corresponding gate region, and components of the same type (e.g., P-type or N-type) may be formed to be overlapping in the z-direction. For example, as illustrated in FIG. 3, the transistors 239 and 246 may be the same type of transistor (e.g., P-type or N-type), and the transistors 244 and 254 may be the same type of transistor (e.g., P-type or N-type). For the purpose of illustration, assume that the transistors 239 and 246 may be, for example, P-type transistors, and the transistors 244 and 254 may be N-type transistors, but embodiments are not limited thereto.

As shown in FIG. 3, the transistors 239 and 246 overlap each other in the z-direction, and the transistors 244 and 254 overlap each other in the z-direction. Each of the transistors 239, 244, 246, and 254 may have corresponding source/drain electrodes (e.g., electrodes 216/218/228/230) that are electrically connected to the source and drain regions of the corresponding transistor. The source/drain electrodes may further be electrically interconnected to or isolated from other components in the semiconductor device 200 according to the circuit design of the semiconductor device 200.

According to some example embodiments, the nanosheet layers in the different tiers may be laterally offset to allow source/drain electrodes in lower tiers to bypass the nanosheet layers and components in higher tiers according to the circuit structure of the semiconductor device 200. For example, as illustrated in FIGS. 3 and 4, the nanosheet layers in the upper tier 204 are at least partially laterally offset in the x-y plane from the nanosheet layers in the lower tier 206 such that at least a portion of the lower nanosheet layers do not overlap with the nanosheet layers in higher tiers along the z-direction, thereby enabling the electrodes corresponding to the bottom nanosheet layers to connect to the bottom nanosheet layers without passing or shorting through the top nanosheet layers.

Depending on the circuit design of the semiconductor device 200, the top tier source/drain electrodes may be electrically connected or electrically isolated from each other. In the front perspective view of the semiconductor device 200, the top source/drain electrodes 216/218 may be directly electrically connected to the bottom source/drain electrodes 228/230 such that the bottom source/drain electrodes 228/230 are physically adjacent to, and in contact with the top source/drain electrodes 216/218, and the bottom source/drain electrodes 228/230 pass or short through the top tier nanosheet layers 210 and 212. A similar direct electrical connect may exist between the top source/drain electrodes and the bottom source/drain electrodes of the transistors 254 and 244.

Figure 4:
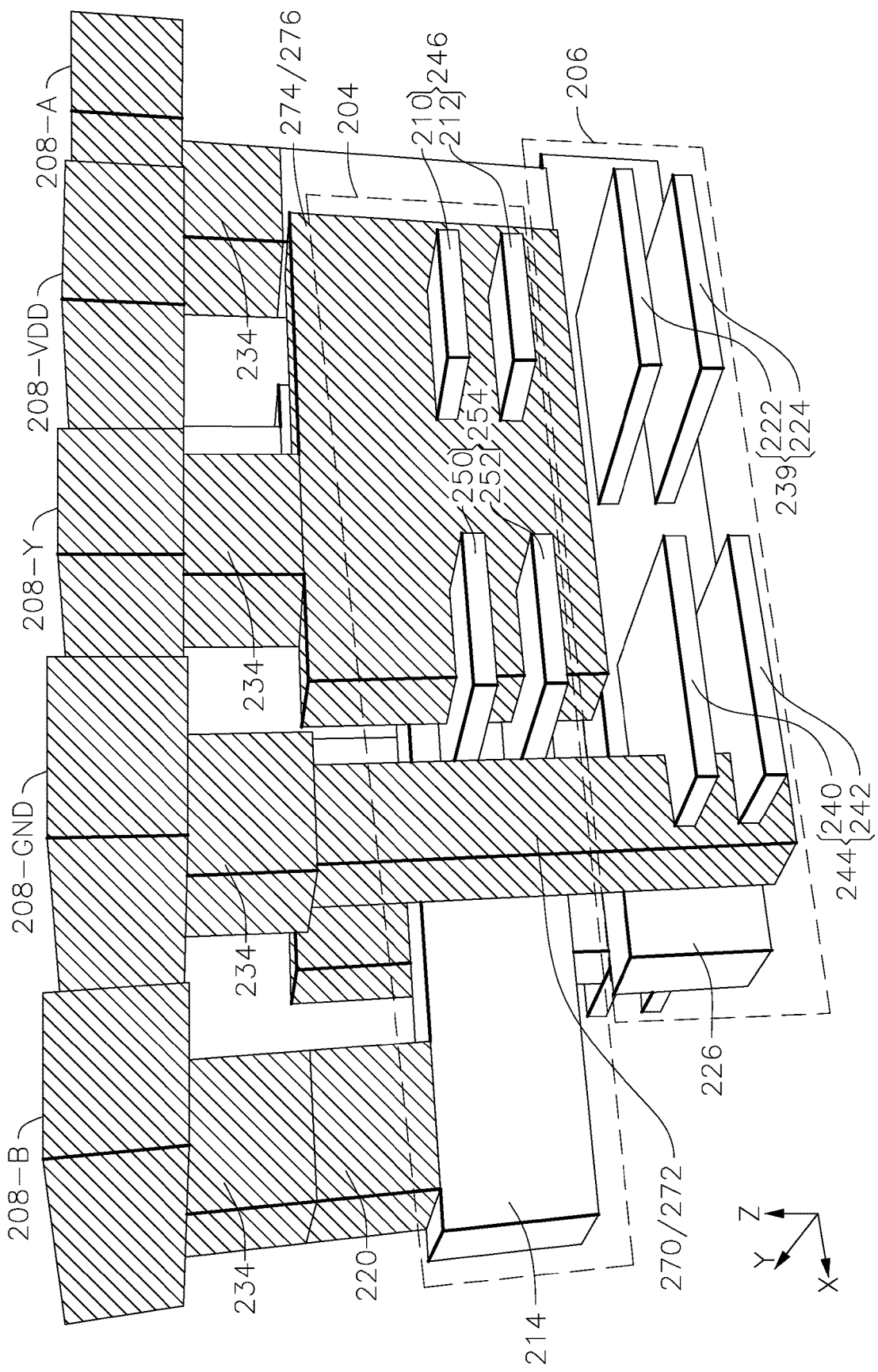
FIG. 4 illustrates another perspective view of a semiconductor device, according to some example embodiments.

In contrast, as illustrated in FIG. 4, depending on the circuit design of the semiconductor device 200, one or more bottom tier source/drain electrodes may be electrically and/or physically isolated from the top tier source drain electrodes. For example, as shown in FIG. 4, the bottom source/drain electrodes 270/272 corresponding to the bottom tier transistor 244 may be laterally offset, and physically and electrically isolated, from the nanosheet layers 250 and 252 of the top tier transistor 254 as well as the top tier source/drain electrodes 274/276 corresponding to the top tier transistor 254. That is, the source drain electrodes 270/272 do not pass or short through the nanosheet layers 250 and 252 because the nanosheet layers 240 and 242 are at least partially laterally offset in the x-y plane from the nanosheet layers 250 and 252 along the z-direction.

FIG. 5 illustrates a top or layout view of the semiconductor device 200, according to some example embodiments. As illustrated in FIG. 5, in contrast to related-art structures, the voltage supply lines (e.g., Vdd and GND) of the metal layer 208 are between the gate signal lines. For example, as shown in FIG. 5, the metal layer 208 may include a first gate signal line 208-A connected to the bottom gate region 226 (shown, for example, in FIG. 3). The metal layer 208 may further include a second gate signal line 208-B connected to the top gate region 226 (shown, for example, in FIG. 3). One or more source or drain signal lines 208-Y may be connected to the source or drain regions of the components of the semiconductor device 200. Finally, the metal layer 208 may include a high voltage line 208-Vdd and a low voltage line 208-GND which may be connected to one or more of the source or drain regions of the components of the semiconductor device 200 according to the design of the semiconductor device 200.

As illustrated in FIGS. 3-5, the bottom gate region 226 and the top gate region 214 overlap partially in the z-direction, but are also laterally offset in the x-y plane such that the bottom gate region 226 and the top gate region 214 do not overlap entirely and the electrode 232 is able to electrically connect to the bottom gate region 226 without passing or shorting through the top gate region 214. Additionally, as shown in FIG. 5, and in contrast to related-art structures in which the high-voltage lines and low-voltage lines are located at the outside boundaries or periphery of the cell, the high voltage line 208-Vdd, the low voltage line 208-GND, and/or the source or drain signal lines 208-Y may be located between the first gate signal line 208-A and the second gate signal line 208-B, thereby enabling the lower tier gate region (e.g., the gate region 226) to be connected to the first gate signal line 208-A without shorting through the top or higher tier gate region 214.

Thus, as illustrated and described above with respect to FIGS. 1-5, some example embodiments according to the present disclosure may include a plurality of stacked channel devices of the same type (e.g., P-type or N-type). Although the channel devices described above with respect to the semiconductor device 200 are characterized as being transistors formed with nanosheet layers, embodiments of the present invention are not limited thereto, and may further include, for example, nanowires, FinFETs, or any other suitable active channel components. As illustrated above, the bottom and top channels may be electrically and physically isolated from each other within the overall semiconductor device to form various distinct semiconductor components that may be interconnect according to the circuit design of the overall semiconductor device. The top and bottom source and drain regions may be electrically and physically isolated from each other to form distinct source and drain terminals. Additionally, the bottom and top gate regions may be electrically and physically isolated from each other to form distinct gate terminals. Some example embodiments may include a top source/drain contact that connects the top source/drain terminal to a first via level and a conductive layer for receiving high/low power voltages and/or data signals. Some example embodiments may include a bottom tier source/drain contact that connects the bottom source/drain terminal to the top tier source/drain contact. Some example embodiments may further include a bottom tier source/drain contact that connects the bottom tier source/drain terminal to the top tier source/drain terminal. According to some example embodiments, a bottom tier source/drain contact may connect a bottom tier source drain terminal to the first via level.

Some example embodiments may further include a bottom tier gate contact that connects the bottom tier gate terminal to the first level via. Some example embodiments may further include staggered top tier and bottom tier channel cell architectures that enable the bottom tier contacts for the source, drain, and gate regions to connect to the first vial level without connecting to, or passing through, the top tier channel terminals. Inbound power rail and signal lines may be arranged to according to the above staggered arrangement.

Some example embodiments may further include a compatible buried power rail architecture that enables shorter cells with improved density.

According to some example embodiments, the stacked channel devices overlapping each other may be of the same type (e.g., P-type or N-type) and may include any suitable semiconductor material including, for example, Si, SiGe, TMD, and the semiconductor material may be crystalline or non-crystalline according to various embodiments. Additionally, various contacts, power rails, or via levels as described above may be formed of any suitable conductive or metal material including, for example, Ti, Ta, TiN, TaN, Co, Ru, Cu, and W.

Although this disclosure has been described in certain specific embodiments, those skilled in the art will have no difficulty devising variations to the described embodiment, which in no way depart from the scope of the present disclosure. Furthermore, to those skilled in the various arts, the disclosure itself herein will suggest solutions to other tasks and adaptations for other applications. It is the applicant's intention to cover by claims all such uses of the disclosure and those changes and modifications which could be made to the embodiments of the disclosure herein chosen for the purpose of disclosure without departing from the scope of the disclosure. Thus, the present embodiments of the disclosure should be considered in all respects as illustrative and not restrictive, the scope of the disclosure to be indicated by the appended claims and their equivalents rather than the foregoing description.

What is claimed is:

1. A semiconductor device comprising:
   a substrate;
   a first semiconductor layer over the substrate, the first semiconductor layer being a first type of semiconductor device and connected to a first gate electrode; and
   a second semiconductor layer over the substrate and the first semiconductor layer, the second semiconductor layer being the first type of semiconductor device and connected to a second gate electrode, wherein a first portion of the first semiconductor layer overlaps the second semiconductor layer when viewed in a direction perpendicular to a plane of the substrate and a second portion of the first semiconductor layer is laterally offset from the second semiconductor layer when viewed in the direction perpendicular to the plane of the substrate, and
   wherein the first gate electrode is laterally offset from the second gate electrode when viewed in the direction perpendicular to the plane of the substrate.

2. The semiconductor device of claim 1, further comprising:
   a third semiconductor layer over the substrate, the third semiconductor layer being a second type of semiconductor device different from the first type of semiconductor device; and
   a fourth semiconductor layer over the substrate, the fourth semiconductor layer being the second type of semiconductor device.

3. The semiconductor device of claim 2, wherein a first portion of the third semiconductor layer overlaps the fourth semiconductor layer when viewed in the direction perpendicular to the plane of the substrate and a second portion of the third semiconductor layer is laterally offset from the fourth semiconductor layer when viewed in the direction perpendicular to the plane of the substrate.

4. The semiconductor device of claim 2, wherein the first, second, third, and fourth semiconductor layers correspond to first, second, third, and fourth transistors, respectively.

5. The semiconductor device of claim 4, wherein a first portion of a gate region of the first and third transistors overlaps a gate region of the second and fourth transistors when viewed in the direction perpendicular to the plane of the substrate, and a second portion of the gate region of the first and third transistors is laterally offset from the gate region of the second and fourth transistors when viewed in the direction perpendicular to the plane of the substrate.

6. The semiconductor device of claim 1, wherein a first source or drain electrode corresponding to the first semiconductor layer contacts a first source or drain electrode corresponding to the second semiconductor layer, and a second source or drain electrode corresponding to the first semiconductor layer is laterally isolated from a second source or drain electrode corresponding to the second semiconductor layer.

7. The semiconductor device of claim 1, further comprising a buried power rail between the substrate and the first semiconductor layer.

8. A semiconductor device comprising:
   a first semiconductor layer, the first semiconductor layer being a first type of semiconductor device;
   a first gate region at least partially encapsulating the first semiconductor layer;
   a first gate electrode connected to the first gate region;
   a second semiconductor layer over the first semiconductor layer, the second semiconductor layer being the first type of semiconductor device;
   a second gate region at least partially encapsulating the second semiconductor layer, and
   a second gate electrode connected to the second gate region;
   wherein the first semiconductor layer, a first portion of the first gate region, the second semiconductor layer, and the second gate region overlap when viewed along a z-direction, and a second portion of the first gate region is laterally offset from the second gate region when viewed along the z-direction, and
   wherein the first gate electrode is laterally offset from the second gate electrode when viewed along the z-direction.

9. The semiconductor device of claim 8, further comprising a substrate, wherein the first semiconductor layer, the first gate region, the second semiconductor layer, and the second gate region are formed over the substrate when viewed along the z-direction.

10. The semiconductor device of claim 9, wherein a first portion of the first semiconductor layer overlaps the second semiconductor layer when viewed in a direction perpendicular to a plane of the substrate and a second portion of the first semiconductor layer is laterally offset from the second semiconductor layer when viewed in the direction perpendicular to the plane of the substrate.

11. The semiconductor device of claim 9, further comprising:
   a third semiconductor layer over the substrate, the third semiconductor layer being a second type of semiconductor device different from the first type of semiconductor device; and
   a fourth semiconductor layer over the substrate, the fourth semiconductor layer being the second type of semiconductor device.

12. The semiconductor device of claim 11, wherein a first portion of the third semiconductor layer overlaps the fourth semiconductor layer when viewed in the direction perpendicular to a plane of the substrate and a second portion of the third semiconductor layer is laterally offset from the fourth semiconductor layer when viewed in the direction perpendicular to the plane of the substrate.

13. The semiconductor device of claim 11, wherein the first, second, third, and fourth semiconductor layers correspond to first, second, third, and fourth transistors, respectively.

14. A method of making a semiconductor device, the method comprising:
   forming a first semiconductor layer over a substrate, the first semiconductor layer being a first type of semiconductor device and connected to a first gate electrode; and
   forming a second semiconductor layer over the substrate and the first semiconductor layer, the second semiconductor layer being the first type of semiconductor device and connected to a second gate electrode, wherein a first portion of the first semiconductor layer overlaps the second semiconductor layer when viewed in a direction perpendicular to a plane of the substrate and a second portion of the first semiconductor layer is laterally offset from the second semiconductor layer when viewed in the direction perpendicular to the plane of the substrate, and
   wherein the first gate electrode is laterally offset from the second gate electrode when viewed in the direction perpendicular to the plane of the substrate.

15. The method of claim 14, further comprising:
   forming a third semiconductor layer over the substrate, the third semiconductor layer being a second type of semiconductor device different from the first type of semiconductor device; and
   forming a fourth semiconductor layer over the substrate, the fourth semiconductor layer being the second type of semiconductor device.

16. The method of claim 15, wherein a first portion of the third semiconductor layer overlaps the fourth semiconductor layer when viewed in the direction perpendicular to the plane of the substrate and a second portion of the third semiconductor layer is laterally offset from the fourth semiconductor layer when viewed in the direction perpendicular to the plane of the substrate.

17. The method of claim 15, wherein the first, second, third, and fourth semiconductor layers correspond to first, second, third, and fourth transistors, respectively.

18. The method of claim 17, wherein a first portion of a gate region of the first and third transistors overlaps a gate region of the second and fourth transistors when viewed in the direction perpendicular to the plane of the substrate, and a second portion of the gate region of the first and third transistors is laterally offset from the gate region of the second and fourth transistors when viewed in the direction perpendicular to the plane of the substrate.

19. The method of claim 14, wherein a first source or drain electrode corresponding to the first semiconductor layer contacts a first source or drain electrode corresponding to the second semiconductor layer, and a second source or drain electrode corresponding to the first semiconductor layer is laterally isolated from a second source or drain electrode corresponding to the second semiconductor layer.

20. The method of claim 14, wherein at least one of the first or second semiconductor layer comprises a nanosheet layer, a nanowire layer, or a fin layer.

* * * * *